United States Patent [19] [11] 4,258,411
Sherman [45] Mar. 24, 1981

[54] ELECTRONIC DEVICE PACKAGING ARRANGEMENT

[75] Inventor: Charles J. Sherman, Westminster, Colo.

[73] Assignee: Bell Telephone Laboratories, Incorporated, Murray Hill, N. J. 07974

[21] Appl. No.: 40,648

[22] Filed: May 21, 1979

[51] Int. Cl.³ .............................................. H05K 7/20
[52] U.S. Cl. .................................... 361/386; 361/387; 174/52 PE
[58] Field of Search .......... 174/52 PE, 52 FP, 16 HS; 357/72, 81, 82; 339/17 CF; 361/331, 380, 400, 405, 417, 381, 382, 383, 386–389

[56] References Cited
U.S. PATENT DOCUMENTS

| | | | |
|---|---|---|---|
| 3,689,804 | 9/1972 | Ishihama | 174/52 PE |
| 3,859,570 | 1/1975 | Veranth | 361/386 |
| 3,930,114 | 12/1975 | Hodge | 174/16 HS |
| 3,936,928 | 2/1976 | Hopp | 174/52 FP |
| 4,037,270 | 7/1977 | Ahmann | 174/52 FP |
| 4,079,511 | 3/1978 | Grabbe | 174/52 FP |
| 4,103,321 | 7/1978 | Gansert | 174/16 HS |

OTHER PUBLICATIONS

Internal Thermal Design of LSI Package, Chu, IBM Tech. Discl. Bull., vol. 19, No. 12, May 1977, p. 4690.

Primary Examiner—Gerald P. Tolin
Attorney, Agent, or Firm—James M. Graziano

[57] ABSTRACT

The subject electronic device packaging arrangement is designed to enhance heat transfer from an electronic device to the printed circuit board to which it is attached. This is accomplished by employing a thermally conductive base having a depression in the top thereof into which the electronic device is placed and bonded. The base has a protuberance in the bottom thereof corresponding to the depression in the top, which protuberance is attached to the associated printed circuit board. The protuberance on the base is formed to be in contact with the printed circuit board surface to provide thermal dissipation into the board by conduction processes. Continuous or segmented conductors are bonded both to the electronic device and to the base. These conductors are bent over the edge of the base to the bottom of the base where they align with corresponding contact points on the printed circuit board.

5 Claims, 1 Drawing Figure

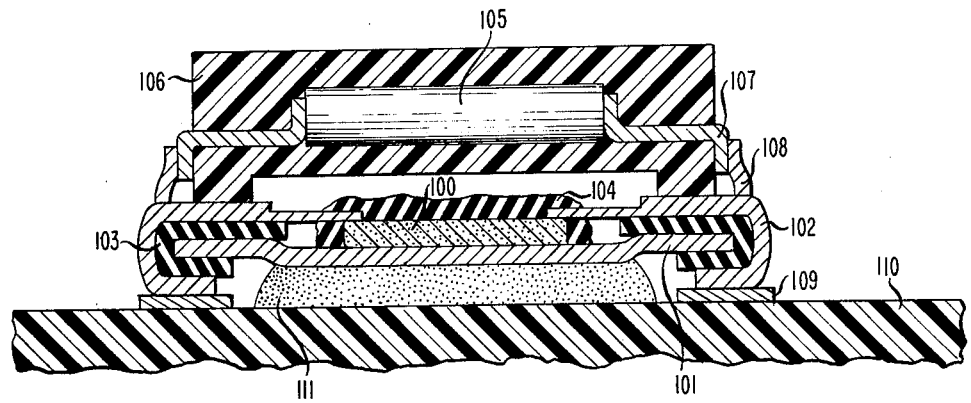

ELECTRONIC DEVICE PACKAGING ARRANGEMENT

TECHNICAL FIELD

This invention relates to electronic device packaging arrangements and, in particular, to a thermally improved base arrangement.

BACKGROUND ART

There have been numerous prior art electronic device packaging arrangements employing improved thermal dissipation apparatus. These prior art packaging arrangements include U.S. Pat. No. 4,037,270 issued July 19, 1977 to G. L. Ahmann et al. The Ahmann patent teaches an electronic device packaging arrangement which provides improved thermal performance by securing the electronic device to a thermal dissipation pad which is, in turn, secured to a conduit through which a coolant is circulated. The disadvantage of this arrangement is that the thermal dissipation apparatus significantly raises the surface of the electronic device above the surrounding printed circuit board. As a result of this, all connections from the electronic device to the printed circuit board must be implemented by either free-standing conductors or connections through the electronic device itself to the printed circuit board. The free-standing conductor arrangement requires a large amount of printed circuit board area to implement and the free-standing conductors are also subject to mechanical stress which reduces their reliability. The through-the-device conductor arrangement eliminates these problems but is itself a very costly interconnection method to implement.

DISCLOSURE OF THE INVENTION

The foregoing problem is solved and technical advance achieved by an arrangement which employs a thermally conductive base having a depression in the top thereof into which the electronic device is placed and bonded. The base has a protuberance in the bottom thereof corresponding to the depression in the top, which protuberance is attached to the associated printed circuit board. The protuberance on the base is formed to be in contact with the printed circuit board surface to provide thermal dissipation to the board by conduction processes. Electrical conductors are bonded both to the device and to the base using an insulating material if the base is conductive, and any material if the base is of insulating material. These conductors are bent over the edge of the base and may be attached to the bottom of the base where they align with corresponding contact points on the printed circuit board.

Thus, this thermally conductive base arrangement eliminates the need for free-standing conductors or costly interconnection methods while providing excellent thermal characteristics.

BRIEF DESCRIPTION OF THE DRAWING

FIG. 1 shows the details of the disclosed electronic device packaging arrangement.

DETAILED DESCRIPTION

FIG. 1 illustrates the electronic device packaging arrangement of my invention which employs a thermally conductive base. Base 101 is fabricated from a thermally conductive material such as aluminum and contains a depression in the top thereof. This depression is of sufficient size and depth such that an electronic device 100 may be placed therein and the top surface of electronic device 100 will be approximately the same level as the top surface of the outer rim of base 101. Assembly of this arrangement is implemented by placing electronic device 100 in the depression of base 101 and bonding electronic device 100 in well-known fashion to thermally conductive base 101. Continuous or segmented conductors 102 are joined in well-known fashion both to electronic device 100 and, using an adhesive material 103, to base 101.

Peripheral leads 102 extend around the edge of base 101 to the bottom surface thereof as shown in FIG. 1. These leads 102 are arranged such that they align with interconnection pads 109 on printed wiring board 110 and are joined thereto using conventional means. Base 101 is specifically formed to be in contact with printed wiring board 110 to provide thermal dissipation into and through printed wiring board 110 substantially by conduction processes. As shown in FIG. 1, a compliant material 111, such as a thermally conductive gel or a modified flux, can also be used at the interface of base 101 and printed circuit board 110 to enhance the heat transfer to printed circuit board 110. The use of a metal core printed circuit board 110 would further enhance the heat transfer over a conventional printed circuit board. An encapsulating material 104 is provided to cover electronic device 100 for electronic protection.

This entire assembly is further covered by some cap or cover arrangement such as cap 106. Cap 106 is comprised of some suitable plastic material which can also be used to encapsulate an attendant discrete device. For example, capacitor 105 can be molded into cap 106 with capacitor leads 107 extending to the periphery of the cap. Cap 106 is used to cover the entire assembly and is held in place by and also forms an electronic connection with leads 108 which are manufactured as an integral part of the lead frame of base 101, thereby establishing an electronic connection from leads 108 on base 101 to capacitor 105. Cap 106 may be thermally or adhesively bonded to base 101 in order to provide further mechanical and environmental integrity.

While a specific embodiment of the invention has been disclosed, variations in structural detail within the scope of the appended claims are possible and are contemplated. There is no intention of limitation to what is contained in the abstract or the exact disclosure as herein presented. The above-described arrangements are only illustrative of the application of the principles of my invention, and other arrangements may be devised by those skilled in the art without departing from the spirit or the scope of my invention.

I claim:

1. A circuit assemblage which thermally and electrically connects an electronic device to a printed circuit board comprising:
    thermally conductive base means having a depression in the top thereof and a protuberance in the bottom thereof corresponding to said depression in the top;
    wherein said electronic device is mounted in said depression for providing a thermally conductive path between said electronic device and said base means;
    wherein said protuberance of said base means is connected to a matching location on said printed circuit board, providing a thermally conductive path between said electronic device and said printed circuit board;

a plurality of electrical conductor means ohmically attached to both said electronic device and conductors on said printed circuit board, electrically connecting said electronic device to said printed circuit board conductors; and wherein said plurality of electrical conductor means extend from said electronic device along the top surface of said base means and around the edge of said base means and along the bottom surface of said base means where said electrical conductor means are connected to said printed circuit board conductors.

2. The invention of claim 1 wherein said plurality of electrical conductor means are connected to said base means by an insulating adhesive.

3. The invention of claim 2 wherein the depth of said depression is substantially equal to the thickness of said electronic device such that the top surface of said electronic device is approximately level with said top surface of said thermally conductive base means.

4. The invention of claim 2 wherein a plurality of said electrical conductor means are aligned vertically in a spring-like fashion to frictionally engage associated terminals of an attendant discrete device and retain said attendant discrete device therebetween.

5. The invention of claim 4 wherein said attendant discrete device encloses said depression in the top of said base, thereby encapsulating said electronic device.

* * * * *